United States Patent
Matsuki et al.

(10) Patent No.: US 6,537,928 B1
(45) Date of Patent: Mar. 25, 2003

(54) APPARATUS AND METHOD FOR FORMING LOW DIELECTRIC CONSTANT FILM

(75) Inventors: Nobuo Matsuki, Tama (JP); Seijiro Umemoto, Tama (JP); Yasuyoshi Hyodo, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 10/079,078

(22) Filed: Feb. 19, 2002

(51) Int. Cl.⁷ .................. H01L 21/31; H01L 21/469
(52) U.S. Cl. .................. 438/788; 438/787; 427/585; 427/255.28
(58) Field of Search ................. 438/787, 788, 438/680; 427/585, 255.23, 255.28, 255.37

(56) References Cited

U.S. PATENT DOCUMENTS 6,101,970 A * 8/2000 Koshimizu .............. 118/723 E
6,211,622 B1 * 3/2001 Ryoji et al. .............. 315/111.21
6,350,497 B1 * 2/2002 Murayama et al. ......... 427/580
6,468,925 B2 * 10/2002 Campbell et al. .......... 438/771

* cited by examiner

*Primary Examiner*—Alexander Ghyka
(74) *Attorney, Agent, or Firm*—Knobbe Martens Olson & Bear LLP

(57) ABSTRACT

A CVD apparatus includes (i) a reaction chamber; (ii) a reaction gas inlet; (iii) a lower stage on which a semiconductor substrate is placed; (iv) an upper electrode for plasma excitation; (v) an intermediate electrode with plural pores through which the reaction gas passes, wherein a reaction space is formed between the upper electrode and the intermediate electrode; and (vi) a cooling plate disposed between the intermediate electrode and the lower stage, wherein a transition space is formed between the intermediate electrode and the cooling plate, and a plasma-free space is formed between the cooling plate and the lower stage.

14 Claims, 3 Drawing Sheets

APPARATUS AND METHOD FOR FORMING LOW DIELECTRIC CONSTANT FILM

BACKGROUND OF THE INVENTION

1. Field of the Invention

The present invention relates to a plasma CVD (Chemical Vapor Deposition) method for forming a thin film, and particularly to a method for forming a low dielectric constant insulation film for a semiconductor device.

2. Description of the Related Art

A plasma CVD film-forming method is a technique of forming a thin film on a substrate in a reaction space by generating a plasma by bringing microwaves or RF radio-frequency electric power into a reaction chamber. For methods of bringing electric power in, there are the capacity coupling method, the inductive coupling method, the electromagnetic wave coupling method and others. FIG. 1 shows an embodiment of plasma CVD equipment of a parallel-flat-plate type using a capacity coupling method. By placing two pairs of electrically conductive flat electrodes 101, 102 parallel to and opposing each other within a reaction chamber 104, applying RF power 105 to one side and grounding the other side, the plasma is excited between these two electrodes to form a film on a substrate 103. Radio-frequency electric power in a megahertz band of 13.56 MHz or 27 MHz or in a kilohertz band of 400 kHz is applied independently or by synthesizing them. In addition to this, there are the ICP method, the ECR method using microwaves, helicon wave plasma, and surface wave plasma, etc. In such film-forming equipment, a method in which a plasma source is placed at the top and a substrate on which a film is formed is placed at a lower stage, and the lower stage is electrically grounded or a bias voltage is applied, is widely used.

In conventional plasma CVD (chemical vapor deposition), a thin film is formed on a substrate by bringing a reaction gas in a deposition space in which the substrate, on which a thin film is formed, is placed and by making the reaction gas react by thermal and plasma energy. Raising the temperature of the reaction space and the intensity of plasma improves reactivity in the vapor phase, accelerating decomposition and polymerization of material gases.

SUMMARY OF THE INVENTION

Problems to be Resolved

With a conventional reactor structure, however, because a substrate is exposed to the reaction space, the temperature of and near a substrate surface rises if the temperature of the reaction space and the intensity of plasma are raised. Consequently, the intensity of plasma irradiated on the substrate surface is raised, advancing the reaction of products absorbed and deposited on the substrate surface. It is possible to form products with various molecular weights in a vapor-phase reaction by selecting the type of a reaction gas or adjusting the reactivity of the reaction gas. Particularly to deposit a high vapor pressure product with a relatively low molecular weight on a wafer substrate, it is necessary to lower the temperature of and near the substrate surface. To accelerate the reactivity in the vapor phase, it is necessary to raise the temperature of the reaction space and the intensity of plasma. This, however, raises the temperature of a wafer substrate as well and makes it difficult to deposit high vapor pressure products. When depositing reaction products in an interim phase, a problem occurs wherein the reaction of the product deposited on the substrate advances by plasma irradiation.

To avoid this problem, lowering the temperature of and near the substrate surface and the intensity of plasma irradiated on the substrate by lowering the temperature of the reaction space and the intensity of plasma is considered. By doing this, it becomes possible to deposit a high vapor pressure product and slow down a reaction occurring on the substrate surface become possible. In this case, however, reaction efficiency of the reaction space decreases. Using conventional equipment, the reactivity of the reaction space cannot be increased, the temperature of a substrate cannot be lowered, and a reaction occurring on the substrate surface cannot be suppressed.

In an embodiment of the present invention, provided is a CVD apparatus for forming a thin film on a semiconductor substrate by plasma reaction, comprising: (i) a reaction chamber; (ii) a reaction gas inlet for introducing a reaction gas into the reaction chamber; (iii) a lower stage on which a semiconductor substrate is placed in the reaction chamber, said lower stage functioning as a lower electrode; (iv) an upper electrode for plasma excitation in the reaction chamber; (v) an intermediate electrode with plural pores through which the reaction gas passes, said intermediate electrode being disposed below the upper electrode, wherein a reaction space is formed between the upper electrode and the intermediate electrode; and (vi) a cooling plate with plural pores through which the reaction gas passes, said cooling plate being disposed between the intermediate electrode and the lower stage, said cooling plate being controlled at a temperature lower than the intermediate electrode, wherein a transition space is formed between the intermediate electrode and the cooling plate, and a plasma-free space is formed between the cooling plate and the lower stage.

In another aspect of the present invention, provided is a method for forming a thin film on a semiconductor substrate by plasma reaction, comprising the steps of: (a) introducing a reaction gas into an upper section of a reaction chamber; (b) exciting a plasma in the upper section to react the reaction gas by applying electrical power between an upper electrode and a lower stage on which a substrate is place; (c) enclosing the plasma in the upper section by providing below the upper electrode an intermediate electrode having the same electrical potential as the lower stage, said intermediate electrode having plural pores through which the activated reaction gas passes; (d) cooling a section under the upper section by controlling a cooling plate disposed between the intermediate electrode and the lower stage at a temperature lower than the intermediate electrode, said cooling plate having plural pores through which the cooled reaction gas passes, wherein a middle section is formed between the intermediate electrode and the cooling plate; and (e) controlling the lower stage at a temperature lower than the cooling plate, wherein a lower section is formed between the cooling plate and the lower stage, whereby reaction products accumulate on the substrate.

General Aspect of the Present Invention

The present invention can generally be characterized in that it has a reactor structure, in which a reaction space and a deposition space are separated by an intermediate electrode kept at a high temperature and a low-temperature plate whose temperature is adjusted at a low temperature, and which realizes two completely different environments, a reaction space (a Hot area) which is in a high reactivity state at a high temperature and in a plasma state, and a deposition space (a Cool area) which is at a low temperature and substantially in a non-plasma state.

This reactor enables deposition of a high vapor pressure product with a low molecular weight while realizing high reaction efficiency. In a high-reactivity space (Hot area) where a plasma is excited at a high temperature, by decomposing or polymerizing material gases by thermal and plasma energy, the material gases can effectively react in the vapor phase. By passing a reaction gas through the low-temperature Cool area in which substantially no plasma exists, the reaction can be terminated in the vapor phase and simultaneously gases generated are condensed, and high vapor pressure molecules containing water and alcohol can be liquefied and deposited on a substrate.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

General Effects

According to the present invention using the Hot area and the Cool area, reaction gases, in which an organic silicon gas containing ethoxy and/or methoxy (such as Si—O—$C_2H_5$, Si—O—$CH_3$ and Si—$CH_3$) and an oxidizing agent (such as oxygen) are mixed, can react even in a non-plasma state if the temperature is raised to nearly 500° C., and the reaction proceeds, forming a solid product (such as SiO). In an environment at a temperature around 400° C. or lower, although a reaction does not proceed only by heat, by combining plasma effects, a reaction according to the intensity of plasma can be realized and different products can be formed. By intensifying a plasma, a solid product mainly containing SiO can be formed. By lowering the intensity of plasma, a reaction chemical intermediate with a low molecular weight, which contains Si—OH and Si—$CH_3$ groups, can be formed.

By adjusting RF power applied, the intensity of plasma can be adjusted. By repeating alternating application of high power and low power, an end reaction product and a reaction chemical intermediate with a low molecular weight are repeatedly formed in the reaction space. When a gas containing solids generated is brought in the Cool area, the reaction is terminated. Additionally, because the temperature of the gas rises, gas constituents with a low molecular weight, e.g., moisture and alcohol, condense and it becomes possible to deposit a liquid in sol form on a substrate together with solid products.

Basic Configuration

Figure 2:
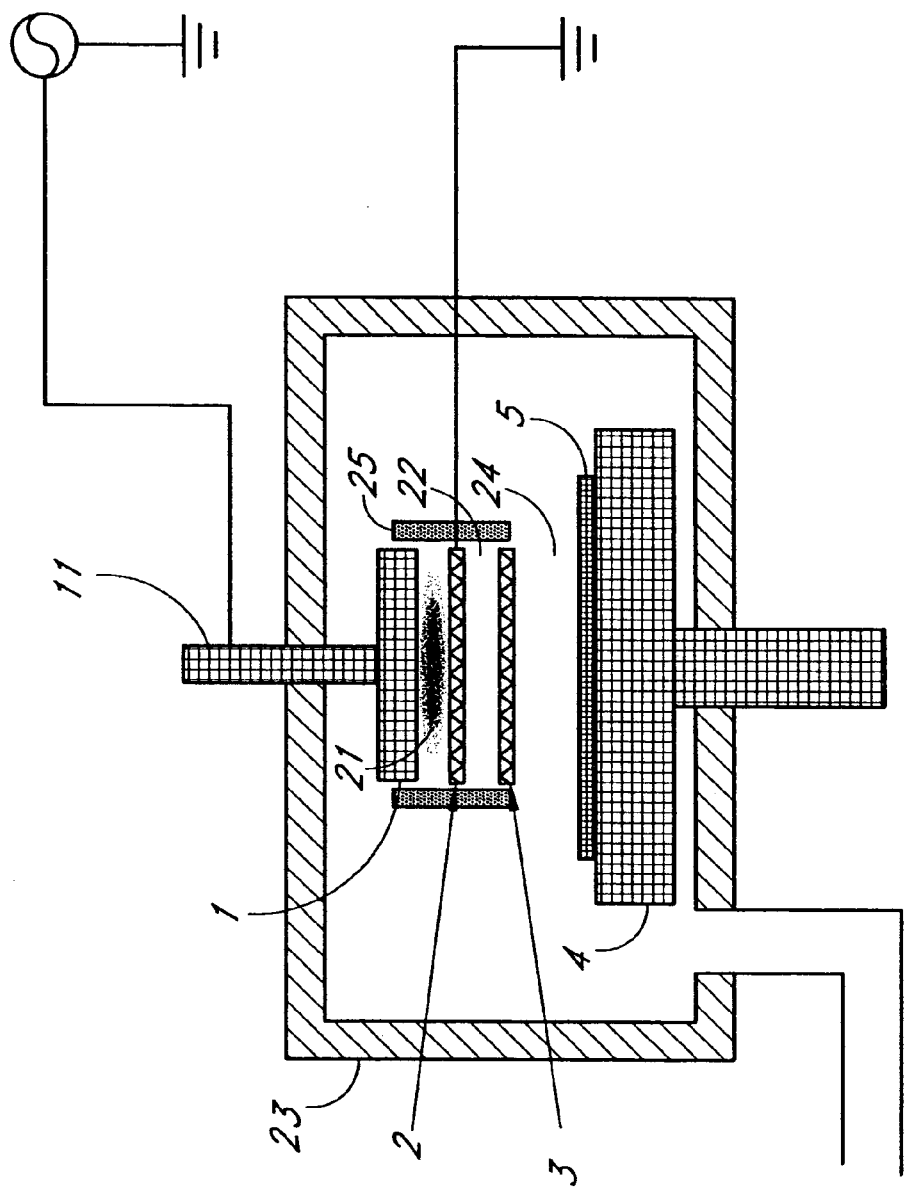
FIG. 2 is a schematic side view showing an embodiment of the apparatus according to the present invention.

FIG. 2 is a schematic side view showing an embodiment of the apparatus according to the present invention. Two conductive electrodes comprising an upper electrode 1 of, e.g., approximately ϕ100 mm (preferably smaller in diameter than a substrate, more preferably 20–75% of the substrate diameter, further preferably 50±10% of the substrate diameter) and an intermediate electrode 2 (having approximately the same diameter as that of the upper electrode 1), a low-temperature plate 3 kept at a low temperature (having approximately the same diameter as that of the upper electrode 1), and a lower stage 4 of approximately Φ250 mm (preferably greater in diameter than the substrate, more preferably 10–50% greater than the substrate) on which a wafer substrate 5 of, e.g., Φ200 mm (preferably 100–350mm in diameter) is placed, are installed in a vacuum container 23 which is a reaction chamber. In the above, the diameter of the upper electrode, the intermediate electrode, or the low-temperature plate is the actual physical diameter, and the effective diameter (which can be used for chemical reactions) may be 50–100% of the actual physical diameter.

The upper electrode 1 and the intermediate electrode 2 are installed at an interval of, e.g., approximate 20 mm (preferably 10–30 mm). The reaction of source gases introduced through an inlet port 11 takes place in a space 21 defined between the upper electrode 1 and the intermediate electrode 2, which space is referred to as a "reaction space" or "hot space". If the distance between the upper electrode 1 and the intermediate electrode 2 is small, the reaction does not progress sufficiently, although the progress of the reaction also depends on the residence time of the source gases in the space. On the other hand, if the distance is large, the reaction efficiency increases significantly, resulting in that no or a little interim reaction occurs and no or a little chemical intermediate is produced.

The intermediate electrode 2 and the low-temperature plate 3 are installed at an interval of, e.g., approximately 10 mm (preferably 5–30 mm including 20 mm). A space 22 defined between the intermediate electrode 2 and the low-temperature plate 3 is referred to as a "transition space" The low-temperature plate 2 is kept at a lower temperature than the intermediate electrode 2, and thus the distance therebetween cannot be very close, although the closer the better. The low-temperature plate 3 is for reducing the temperature immediately downstream of the intermediate electrode 2, so that interim reactions can occur, causing chemical intermediates to accumulate on the substrate 5. One or more additional low-temperature plates can be installed to further reduce the temperature. Additionally, in an embodiment, one or more intermediate electrodes can be installed, wherein the additional intermediate electrodes are controlled at lower temperatures than the first intermediate electrode. The transition space may be slightly larger in diameter than the reaction space (e.g., 5–20%), if they are different.

The low-temperature plate 3 and the lower stage 4 are installed e.g., approximately 40 mm apart (preferably 20–150 mm, more preferably 50–100 mm), running parallel and facing each other. The distance between the low-temperature plate 3 and the lower stage 4 is for promoting deposition of chemical intermediates. A space 24 defined between the low-temperature plate 4 and the lower stage 4 is referred to as a "plasma-free space", "cool space", or "lower region". In view of the chemical reactions, a long distance is preferred, whereas in view of the machine design, a short distance is preferred.

In the above, if the diameter of the reaction space 21 is relatively large, the distance between the intermediate electrode 2 and the substrate 5 needs to be widened. This is because the larger the size of the reaction space, the more the reaction gas is supplied, and then the more the cool space is required.

The reaction space 21 located between the upper electrode 1 and the intermediate electrode 2 is preferably a cylindrical space with an internal diameter of e.g., Φ60 mm (preferably 40–100 mm in diameter or 50–100% of the actual physical diameter of the upper electrode 1) enclosed by an insulator 25. The transition space 22, which is enclosed by the intermediate electrode 2 and the low-temperature plate 3, is also isolated at its periphery by the insulator 25. The insulator 25 is in contact with the upper electrode 1, the intermediate electrode 2, and the low-temperature plate 4 (a gap shown in FIG. 2 simply indicates that the above elements are separate elements).

Reaction gases brought in the reaction space are regulated at a given flow rate by a feeder and a flow regulator. These gases are mixed together and are brought into the inlet port 11 installed on the upper electrode as a reaction gas. The reaction gas flows into the reaction space 21 through pores provided in the upper electrode 1. Independent thermostats may be attached to the upper electrode 1, the intermediate electrode 2, the low-temperature plate 3, and the lower stage 4, respectively. The temperature of the upper electrode 1 and that of the intermediate electrode 2 may be the same, whereas the temperature of the low-temperature plate 3 may be lower than the former, and the temperature of the lower stage 4 may be lower than that. The upper electrode 1 may be kept at approximately 150° C. to 350° C. (in some cases, 100–400° C.; in other cases, 200–300° C.). The intermediate electrode 2 may be kept at a given temperature of approximately 150° C. to 350° C. (in some cases, 100–400° C.; in other cases, 200–300° C.) A suitable temperature range may be selected depending on the type of chemical reaction and the RF power level. If the upper electrode 1 is set at a temperature higher than a thermal reaction temperature of the reaction gas, products adhere to the inside of the upper electrode 1 (on the inlet port 11 side). For this reason, the temperature of the upper electrode 1 preferably be adjusted at a temperature lower than the thermal reaction temperature of the reaction gas. The temperature of the intermediate electrode may be lower than that of the upper electrode. Further, one or more additional intermediate electrodes can be installed with temperature control.

When organic Si gas containing Si—O—$CH_3$ groups, for example, is used as a material gas, or when oxidizing gases such as oxygen and $H_2O$, for example, are added as reaction gases, it may be effective to control the temperature at approximately 250° C. to 300° C.

The low-temperature plate 3 may be kept at 0° C. to 100° C. and the lower stage 4 may be kept at approximately −10° C. to 50° C. In some cases, the low-temperature plate 3 may be kept at a temperature 100–300° C. lower than the temperature of the upper electrode 1 or the intermediate electrode 2, and the lower stage 4 may be kept at a temperature 30° C. to 80° C. lower than the temperature of the low-temperature plate 3.

Figure 3:
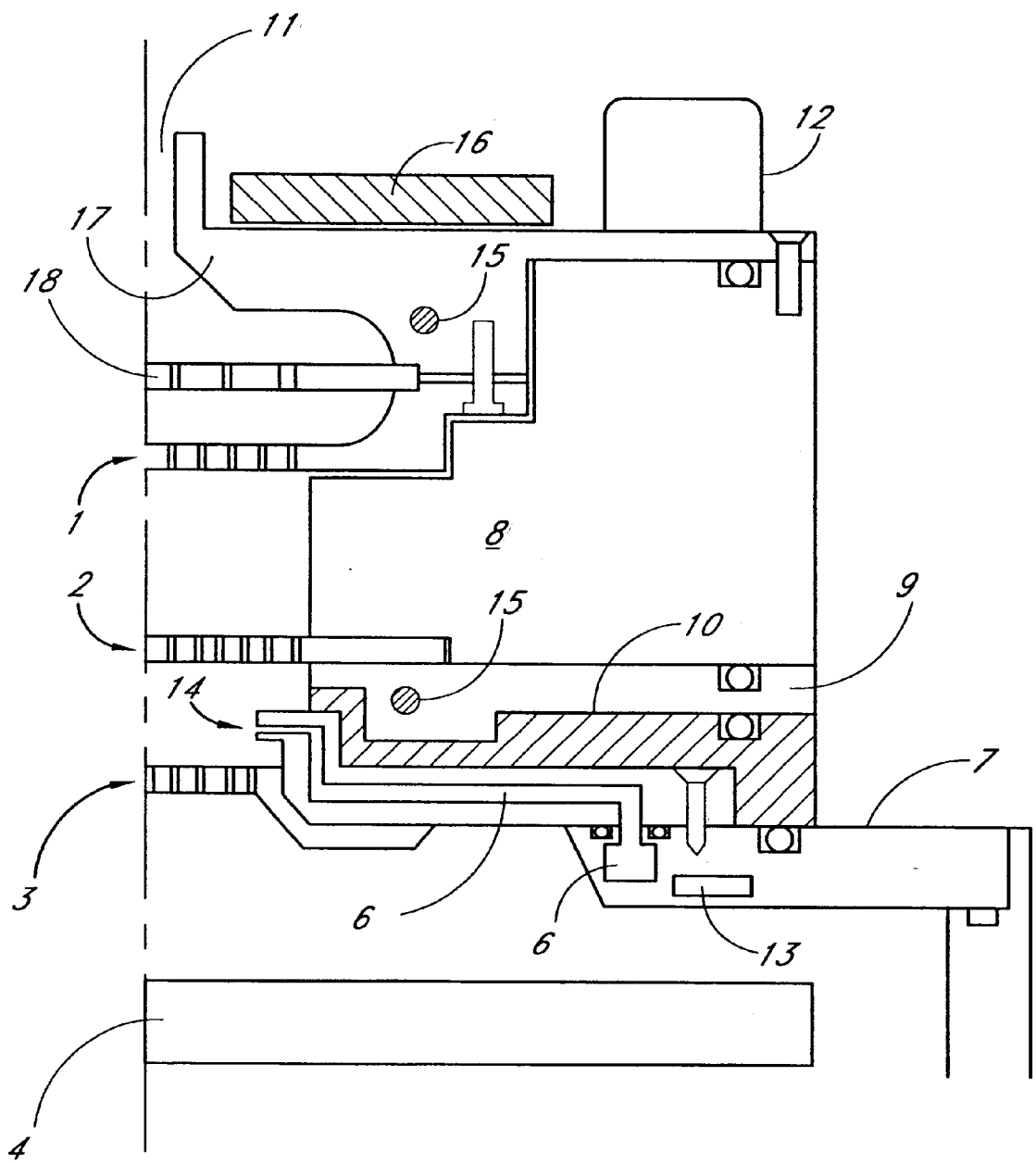
FIG. 3 is a partial view of a schematic cross-section of an embodiment of the apparatus according to the present invention.

FIG. 3 is a view showing a cross-section of deposition equipment (the right half portion) usable in an embodiment of the present invention. Two conductive electrodes comprising an upper electrode 1 (e.g., Φ100 mm in diameter) and an intermediate electrode 2, a low-temperature plate 3 kept at a low temperature, and a lower stage 4 on which a wafer substrate (e.g., Φ200 mm in diameter) is placed, are installed in a vacuum container which is a reaction chamber. The distance between the upper electrode 1 and the intermediate electrode 2, between the intermediate electrode 2 and the low-temperature plate 3, and between the low-temperature plate 3 and the lower stage 4 are 20 mm, 10 mm, and 40 mm, respectively, for example.

In this embodiment, for the upper electrode 1, a conductive plate of 10 mm in thickness with 100 to 8,000 pores of approximately Φ0.5 mm (1,000 pores for the embodiment described later) is used. For the intermediate electrode 2, a conductive plate of 5 mm in thickness with 100 to 3,000 relatively large pores of approximately Φ2 mm (200 pores for the embodiment described later) is used.

In the cooling plate as well, there are 100 to 3,000 pores of approximately Φ2 mm. The low-temperature plate 3 is installed on a cooling block 7 together with a cooling gas inlet block 6. A cooling gas piping 14 leads to the transition space to provide a structure in which a gas can be brought in between the intermediate electrode 2 and the low-temperature plate 3 (cooling plate). A cooling water path 13 is provided in the cooling block 7. Cooling gas passes through a gas inlet path provided inside the cooling plate and flows inside the cooling gas piping, then into the cool space from the pores provided in the cooling plate 3. The cooling gas may be a non-reactive gas such as He, $N_2$, and Ar.

The reaction space located between the upper electrode 1 and the intermediate electrode 2 is a cylindrical space with an internal diameter of Φ60 mm enclosed by an insulator 8. The intermediate electrode 2 is fixed at a temperature control block 9 with a heater 15 and kept at a given temperature. Between the low-temperature plate 3 and the temperature control block 9, a heat-insulating plate 10 made of a material with low thermal conductivity such as ceramics is placed. The transition space, which is enclosed by the intermediate electrode 2 and the low-temperature plate 3, is isolated at its periphery by the heat-insulating plate 10.

Reaction gases brought in the reaction space are regulated at a given flow rate by a feeder and a flow regulator. These gases are mixed together and are brought into an inlet port 11 installed on the upper electrode as a reaction gas. The reaction gas flows into the reaction space through the pores provided in the upper electrode 1. Independent thermostats are attached to the upper electrode 1, the intermediate electrode 2, the low-temperature plate 3, and the lower stage 4, respectively.

Regulated at a given flow rate by a flow regulator, the cooling gas flows into the cool space through the pores provided in the cooling plate 3.

The air inside a lower space (or the cool space) is exhausted by a vacuum pump and is kept at the given pressure of 100 Pa to 10000 Pa. 27 MHz radio-frequency power is applied to the upper electrode 1. The intermediate electrode 2, the cooling plate 3, and the lower stage 4 are electrically grounded. A plasma is excited between the upper electrode 1 and the intermediate electrode 2 by the capacity coupling method. As for the power applied, a high reactivity state and a low reactivity state are repeated continuously by repeating application of high power and low power at an interval of approximately 10 msec to 1 sec.

In the above, in an embodiment, the flow rate of a source gas in the reaction space may be approximately 10–1000 sccm. The RF power exerted in the reaction space may be approximately 10 W–1,500 W. When alternating high power application and low power application, the high power may be 500–1500 W whereas the low power may be 200–400 W. In an embodiment, the size of nanoparticles passing through the intermediate electrode may be approximately 0.5–50 nm.

Additionally, in FIG. 3, a cooling fin 12 is attached to an upper body 17. An insulator 16 is placed on the upper body 17. A distribution plate 18 is attached to the upper body 17 and installed above the upper electrode 1 to efficiently heat the source gas upstream of the upper electrode 1.

Intermediate Electrode and Cooling Plate

As the intermediate electrode 2, an electrode which is an electrically conductive plate of 2–30 mm (e.g., 5 mm) in thickness with 500–10,000 (e.g., 1,000–5,000) relatively large pores formed can be used. This intermediate electrode is designed so that it separates an upper region (reaction space) which is in a plasma state with a relatively high temperature, from a lower region (transition space) beneath the intermediate electrode and at the same time a reaction gas flows from the upper region to the lower region.

In an embodiment, the intermediate electrode may have the following profiles:

(a) The material of the intermediate electrode: conductive material such as Al and AlN.

(b) The size of pores: Approximately 0.5–20 mm.

(c) The size of the intermediate electrode: Approximately the size of a showerhead.

(d) The porosity of the intermediate electrode: Approximately 5–100% (preferably 20–100%) (as long as the material functions as an electrode, the configuration can be in the form of a net.)

(e) The position of the intermediate electrode: The distance between the upper electrode and the intermediate electrode: Approximately 5–30 mm; the distance between the intermediate electrode and the lower electrode: Approximately 10–100 mm.

(f) The thickness of the intermediate electrode: Approximately 2–30 mm.

(g) Production of the intermediate electrode: Production method includes, but is not limited to, mechanically processing a material such as an Al-based material, and then subjecting the surface of the processed material to anodization treatment.

The cooling plate can have the same configurations as the intermediate electrode with regard to the pores. Alternatively, the cooling plate may have different configurations from the intermediate electrode in the ranges described above for the intermediate electrode. One or more additional cooling plates can be installed in order to cool the source gas more efficiently. The cooling plate may be made of aluminum, for example.

Configurations using an intermediate electrode are disclosed in U.S. patent application Ser. No. 09/851,809, filed May 9, 2001, the disclosure of which is herein incorporated in its entirety by reference.

Deposition Reaction

A material gas (source gas) containing silicon (such as an organic silicon gas expressed by at least $Si\alpha O\beta CxHy$ wherein $\alpha$ is an integer of $>0$ and $\beta$, x and y are integers of $>=0$) and added gases such as $N_2O$, He and Ar are controlled at a stated flow through feeding devices 6–8 and flow regulators 9–11, and after these gases are mixed, they are brought in an inlet 11 at the top of the upper electrode as a reaction gas. On the upper electrode, 500–10,000 pores of $\phi 0.5$ mm (3,000 pores formed in the mode for carrying out this invention) are formed, and the reaction gas brought in flows through these pores into a reaction space. The reaction space is exhausted by a vacuum pump and a pre-determined fixed pressure is maintained within the limits of 10 Pa–5000 Pa within which a plasma state can be maintained.

All gases involved in the reaction including material gases and added gases such as oxygen are brought in the upper zone enclosed by the upper electrode and the intermediate electrode, which is kept at a high temperature, and a plasma is excited between the electrodes to make material gases react. In the upper zone which is a reaction space, nanoparticles are generated. The diameter of a nanoparticle is determined by the reaction conditions in the upper zone. The reaction gases are brought in the reaction space (upper zone) and nanoparticles grow while passing through the intermediate electrode. The diameter of the nanoparticle can be adjusted mainly by the time required for the reaction gas molecules to react in the reaction space. The reaction time is the time elapsed for the reaction space (the reaction gas molecules) to pass through the upper zone. In other words, the reaction time can be adjusted by changing the length of time the reaction gas molecules remain in the zone. Additionally, the diameter of the nanoparticle can be adjusted by exposure time when the high-frequency power is turned on. By applying high-frequency RF power for approximately 50 msec, the diameter grows to approximately several nanometers. After that, by turning off the power applied, a plasma ceases to exist in the order of $\mu$sec and a polymerization reaction is terminated. In this method, nanoparticles with a small particle diameter can be obtained by stopping the growth of the particle diameter. By reducing the reactivity of the reaction space by lowering the power applied, it is possible to generate a product in an interim phase. By repeating a step in which high power is applied and a step in which low power is applied, nanoparticles and intermediate reaction products can be generated continuously.

Nanoparticles generated in the upper space pass through a number of pores formed in the intermediate electrode along with a reaction gas and enter the lower region. Since the electric potential of the intermediate electrode and the lower stage is substantially the same or if they are different, the difference in electric potential is small enough not to excite a plasma, the RF power by which a plasma is excited does not exist. Ionized particles which enter the lower region become in non-ionized form state after moving in a distance corresponding to the mean free path and colliding with neutral gas molecules. A distance which an ionized particle can move freely, i.e., the mean free path, can be obtained by the following formula with P (Pa) as a pressure inside a reaction chamber:

$$\lambda(mm)=44/p$$

Although, in a high vacuum region of approximately 104 this free path is hundreds of meters which is very long, by increasing the process pressure to 100 Pa–1000 Pa, however, the mean free path shortens to a very short 0.44 mm–0.044 mm. Consequently, plasma ions having passed through the intermediate electrode collide with neutral molecules in a short period of time, preventing the plasma state from spreading into the lower region.

Additionally, because the low-temperature plate and the lower stage are kept at a low temperature, molecules with a relatively low molecular weight also condense in the lower zone and are deposited on the wafer substrate together with solid products such as particles. Minute particles of tens nanometers or less do not adhere to the wafer substrate if influenced by static electricity. A gas with a low molecular weight, which is contained in a reaction gas, condenses by lowering the temperature, and liquefies. This liquid adheres to nanoparticles, and the nanoparticles can be transferred to the substrate together with the liquid. When a reaction gas sufficiently contains hydrogen and oxygen atoms, water molecules are generated in the reaction space and moisture adheres to the wafer substrate. Because of this moisture, a charging phenomenon of a wafer substrate is suppressed and deposition of nanoparticles on the wafer is accelerated.

The size of the nano-pores can be measured by a high intensity X-ray diffuse scattering optical system (e.g., ATX-E™, Rigaku Denki X-Ray Laboratory in Japan). An example is disclosed in U.S. patent application Ser. No. 09/851,809, filed May 9, 2001, the disclosure of which is herein incorporated in its entirety by reference.

By changing the RF power intensity, progress of the chemical reaction can be controlled, and chemical intermediates can be generated and accumulate on the substrate, in addition to final reaction products. For example, final reaction products are produced as follows:

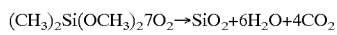

Chemical intermediates may be produced as follows:

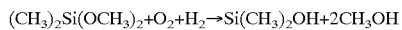

Depending on the source gas, final reaction products and chemical intermediates will vary in accordance with similar reaction schemes to the above.

Chemical intermediates accumulate with moisture generated by the reactions on a surface of a substrate, wherein the chemical intermediates are in a liquid or sol state on the surface. When the substrate is heated, the liquid or sol state chemical intermediates are solidified. The moisture coexisting with the chemical intermediates neutralizes static electricity, thereby promoting deposition of nanoparticles which are included in the solidified layer. On the other hand, final reaction products are in a solid state and accumulate on the surface of the substrate. By mixing or layering the chemical intermediates and the final reaction products on the surface of the substrate, upon subsequent heating treatment of the substrate, the substrate having a hybrid film formed thereon is obtained. The hybrid film has a porous structure with excellent mechanical strength. By alternately forming a layer of chemical intermediates and a layer of final reaction products, the resulting hybrid film can be uniform in depth and be excellent in mechanical strength.

Subsequent Treatment

The thin film formation process takes 1–20 minutes. After a film is formed, a wafer is transported to another vacuum container and is thermally treated. A film-formed wafer is transported to a vacuum container in a nitrogen atmosphere and is thermally treated for 10 seconds to 5 minutes at a temperature of approximately 200–450° C. at reduced pressure (approximately 10–500 Pa). During this treatment, HMDS (Hexamethyldisilano: $Si_2(CH_3)_5$) is brought into this container, and hydrophobicity treatment is performed to suppress the hygroscopicity of a film.

Comparison with Configuration Using No Cooling Plate

In the present invention, a cooling plate is used in addition to an intermediate electrode. It is possible to separate an upper region and a lower region using only an intermediate electrode without a cooling plate as described in U.S. patent application Ser. No. 09/851,809, filed May 9, 2001. However, the use of a cooling plate is advantageous as explained below.

Comparing an embodiment of the present invention with an apparatus using no cooling plate can be summarized below (this is simply an example and does not limit the present invention).

| | The Present Invention | Technology without Cooling Plate |
|---|---|---|
| Hardware Configuration | An intermediate electrode and a cooling plate | An intermediate electrode only |
| Reaction Space Size | Diameter: smaller than a wafer substrate (e.g., ½) | Diameter larger than a wafer substrate |
| Total Flow of Reaction Gas | Process using a flow of beyond 200 sccm (e.g., 1000 sccm or more) | A small flow of 100 to 200 sccm |

In the technology without using a cooling plate, if the total flow of a reaction gas is increased, the reaction gas cannot be sufficiently cooled down in the deposition space. As a result, the temperature of a substrate surface rises and products with a low molecular weight cannot be sufficiently liquefied. Because of this, a total flow of the reaction gas cannot be increased beyond 200 sccm, causing poor gas diffusion effects and making deposition on the whole surface impossible. In an embodiment of the present invention, by using a cooling plate and reducing the size of a reaction space, even with a large flow of approximately 3,000 sccm, the reaction gas is sufficiently cooled down in the deposition space, and solid particles and liquid products are deposited on the entire substrate surface efficiently. Additionally, because deposition is possible under conditions with a large flow, a film can be formed evenly on the entire substrate surface.

Comparison with Other Techniques

Under discussion is a technology in which a remote plasma unit is attached outside a reactor, an added gas such as Ar and oxygen is brought in the remote plasma unit, a plasma is excited by high-frequency power to activate the added gas, the activated added gas and a main material gas brought in from a different system are mixed inside the reactor or immediately before being brought into the reactor, and a film is formed inside the reactor. In this case as well, because the main material gas is made to react inside the reactor in which a wafer substrate is placed, it is impossible to separate a space used for a reaction and a space used for a reaction completion/deposition.

Further, in the case of ion implantation equipment, there is an example which uses an intermediate electrode as a grid electrode in a space between a plasma source and a wafer. The object of the ion implantation equipment is to irradiate ions such as ionized phosphorus, boron, etc. on a Si substrate to implant (dope) these ions on a substrate surface. Consequently, to enable ions to reach a wafer placed on a stage without colliding with other molecules, it is designed that the pressure in a reaction chamber is maintained at a high vacuum of $10^{-4}$ Pa or less, the mean free path of molecules is long to make the number of molecular collisions sufficiently small. Additionally, by applying a voltage difference between an intermediate electrode and a wafer stage, ions passing through the intermediate electrode are selected.

In the ion implantation equipment, since the collision of atoms and molecules in a reaction space is suppressed, a polymerization reaction in a vapor phase does not occur. Additionally, because ions at their high-energy state reach a wafer, these ions are not accumulated on the wafer and are doped inside the wafer. In this invention, by increasing the atmospheric pressure in a reaction space to facilitate a polymerization reaction in a vapor phase, minute particles are generated in a vapor phase. Additionally, these minute particles deposit on a wafer without penetrating inside a wafer substrate.

Experimental Results

EXAMPLE 1

100 sccm of Dimethyldimetoxysilane(DM-DMOS): $(CH_3)_2Si(OCH_3)_2$ as a material gas and 70 sccm of $O_2$ and $H_2$:100 sccm and Ar:3000 sccm as added gases were mixed and brought in a reaction chamber as a reaction gas. The pressure inside the reaction chamber was maintained at $1.3 \times 10^3$ Pa at all times by exhausting the air by a vacuum pump. 27 MHz RF power was applied to the upper electrode repeatedly by alternating high power (1200 W) with which nanoparticles were formed in a high-power step, and low power (300 W) with which products with a relatively low molecular weight were formed in a low-power step. The upper electrode was kept at a given temperature of 200° C., the intermediate electrode was kept at a given temperature of 200° C., and the cooling plate and the lower stage were kept at 70° C. and at 0° C. respectively. After deposition, a wafer substrate placed on the lower stage was inserted into a vacuum container used for thermal treatment. Drying in the $N_2$ atmosphere and hydrophobing by HMDS were conducted, and a film was formed on the whole substrate surface. A dielectric constant measured by applying 1 MHz voltage to the film formed under these conditions was 2.0 and the diameter of a nanoparicle comprising the film was approximately 10 nm or less and the median diameter was approximately 1 nm, which represented the size of nano-particles.

Comparative Example 1
(No Cooling Plate)

20 sccm of Dimethyldimetoxysilane (DM-DMOS):$(CH_3)_2Si(OCH_3)_2$ as a material gas, 100 sccm of $O_2$ as an added gas, $H_2$:20 sccm, Ar:50 sccm, and He:50 sccm were mixed, and the mixed gas was brought into a reaction chamber as a reaction gas. The pressure within the reaction chamber was maintained at $2 \times 10^3$ Pa by constantly exhausting the gas by a vacuum pump. 300 W 13.56 MHz RF power was applied to an upper electrode. A temperature of the upper electrode, an intermediate electrode and a lower stage was adjusted at a fixed temperature of 170° C., 50° C. and 0° C., respectively. A wafer substrate set in the lower stage was inserted in a vacuum container for thermal treatment after a film was formed, and drying in a $N_2$ atmosphere and hydrophobicity treatment by HMDS were performed. As a result, a film was formed only in an area of approximately φ50 mm from the center of the wafer, and no film was formed in a periphery area outside the inner area on the wafer. The measured dielectric constant of a film formed under these conditions was 1.90, and the film had nano-pores having a diameter of approximately 10 nm or less and the median diameter was approximately 1 nm, which represented the size of nano-particles.

Comparative Example 2
(Conventional Technology)

Figure 1:
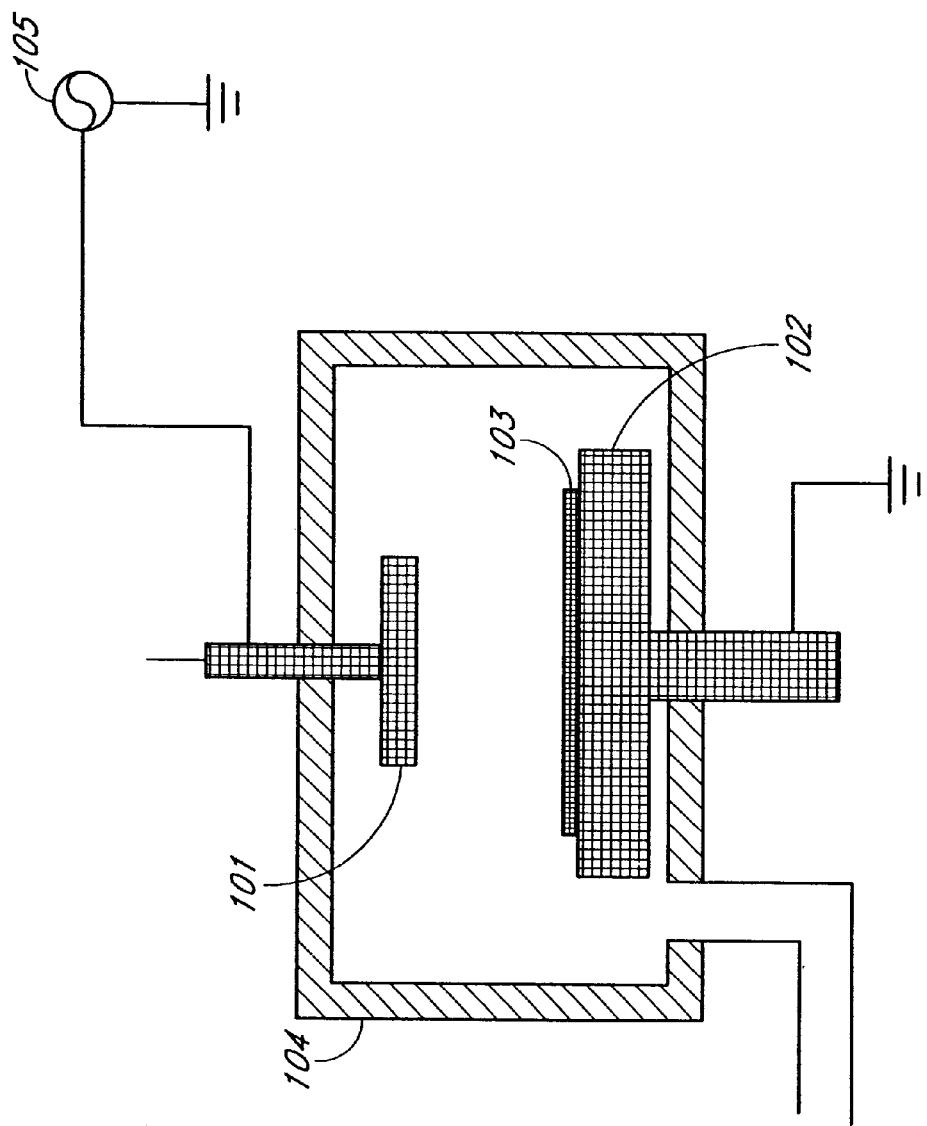
FIG. 1 is a schematic side view showing a conventional CVD apparatus.

An experiment of forming a low dielectric constant film using a plasma CVD method of a parallel-flat-plate type was conducted. FIG. 1 shows an embodiment of plasma CVD equipment used for a film-forming experiment. With an electrically conductive circular plate of φ250 mm used as a lower stage and electrically conductive circular plate of φ250 mm having a limitless number of pores used as an upper electrode, these plates were installed parallel to and opposing each other at an interval of 24 mm within a reaction chamber. A temperature of the lower stage was kept at 400° C. at all times. The gas within the reaction chamber was constantly exhausted using a vacuum pump and the pressure was maintained at a stated pressure.

The wafer of a substrate on which a film is formed was set in the lower stage, 120 sccm of Dimethyldimetoxysilane (DM-DMOS):$(CH_3)_2Si(OCH_3)_2$ and He:100 sccm were mixed, and the mixed gas was brought into a reaction chamber as a reaction gas through the pores of the upper electrode. A pressure within the reaction chamber was maintained at $6.7 \times 10^2$ Pa, the lower stage was electrically grounded and 1200 W 13.56 MHz RF power was applied to an upper electrode to form a film on a wafer substrate. The measured dielectric constant of a film formed under these conditions was 2.76.

Industrial Applicability

With the present invention, using plasma CVD, deposition of a low-dielectric-constant film with a dielectric constant of 2.5 or less becomes possible. Using this low-dielectric-constant film as an insulation film for next-generation highly integrated microchips, delay caused by wiring capacity can be lowered and the working speed of a microchip can be substantially increased.

Various Embodiments of the Present Invention

As explained above, the present invention can be adopted to a plasma CVD apparatus. The present invention includes the following various embodiments, wherein each embodiment can be employed singly or in combination with two or more:

1) A plasma CVD deposition apparatus which comprises at least one conductive plate (intermediate electrode) with multiple holes between an upper space in which a plasma is generated and a lower space in which a substrate, on which a film is formed, is placed; further, which is characterized in that the apparatus comprises a structure for having a plasma source over the intermediate electrode, exciting a plasma in the upper space of the intermediate electrode, making source gases react, placing a substrate in a space lower than the intermediate electrode, and depositing products on the substrate, and further characterized in that the lower space is divided. into a transition space and a plasma-free space by a cooling plate with multiple holes having a temperature lower than that of the intermediate electrode.
2) The apparatus may have more than one transition spaces formed by more than one cooling plates.
3) The reaction space may be smaller in diameter than the substrate.
4) The apparatus may comprise a structure for bringing all gases such as material gases and additive gases contributing to a reaction into the reaction space in which a plasma is excited.
5) The apparatus may have an upper electrode provided over the intermediate electrode, and 13.56 MHz or 27 MHz RF radio-frequency power may be applied to the upper electrode for exciting a plasma in the reaction space between the upper electrode and the intermediate electrode.
6) The upper electrode may include a heating mechanism.
7) The upper electrode may be controlled at a temperature of 150° C. or higher.
8) The upper electrode may be controlled at a temperature of 200° C. or higher.
9) The intermediate electrode may be controlled at a temperature of 100° C. or higher.
10) The cooling plate (low-temperature plate) may be controlled at a temperature of 100° C. or lower.
11) The apparatus may have a structure in which a cooling gas can be brought into the transition space between the intermediate electrode and the low-temperature plate.
12) The intermediate electrode and a lower stage on which the substrate is placed are electrically connected to provide the same electrical potential (no difference in electrical potential).
13) The apparatus may comprise a power source which operates to repeat a first step of applying power for a pre-set period of time of 1 msec or longer, and a second step of applying power higher than that applied in the first step for a pre-set period of time of 1 msec or longer.
14) The apparatus may comprise a power source which operates a step of intermittently applying power for a pre-set period of time of 1 msec or longer.
15) The power may be pulse radio-frequency power applied at an interval of 1msec or shorter.
16) The apparatus may form a film containing nanoparticles with diameter of 50 nm or less using a reaction gas containing at least Si, C, H and O elements.
17) The lower stage may be controlled at a temperature of 100° C. or lower.
18) The apparatus may form a low-dielectric-constant film with a dielectric constant of 2.5 or less upon performing thermal treatment.
19) A non-reactivity gas can be brought into the transition space.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a thin film on a semiconductor substrate by plasma reaction, comprising the steps of:
   introducing a reaction gas into an upper section of a reaction chamber;
   exciting a plasma in the upper section to react the reaction gas by applying electrical power between an upper electrode and a lower stage on which a substrate is place;
   enclosing the plasma in the upper section by providing below the upper electrode an intermediate electrode having the same electrical potential as the lower stage, said intermediate electrode having plural pores through which the activated reaction gas passes;
   cooling a section under the upper section by controlling a cooling plate disposed between the intermediate electrode and the lower stage at a temperature lower than the intermediate electrode, said cooling plate having plural pores through which the cooled reaction gas passes, wherein a middle section is formed between the intermediate electrode and the cooling plate; and
   controlling the lower stage at a temperature lower than the cooling plate, wherein a lower section is formed between the cooling plate and the lower stage, whereby reaction products accumulate on the substrate.

2. The method according to claim 1, wherein 13.56 MHz or 27 MHz radio-frequency power is applied to the upper electrode for exciting a plasma.

3. The method according to claim 1, wherein the upper electrode is controlled at a temperature of 150° C. or higher.

4. The method according to claim 3, wherein the upper electrode is controlled at a temperature of 200° C. or higher.

5. The method according to claim 1, wherein the intermediate electrode is controlled at a temperature of 100° C. or higher.

6. The method according to claim 1, wherein the cooling plate is controlled at a temperature of 100° C. or lower.

7. The method according to claim 1, wherein a cooling gas is brought into the middle section.

8. The method according to claim 7, wherein the cooling gas is a non-reactivity gas.

9. The method according to claim 1, wherein the lower stage is controlled at a temperature of 100° C. or lower.

10. The method according to claim 1, wherein the plasma exciting step comprises repeating a first step of applying power to the upper electrode for a pre-set period of time of 1 msec or longer, and a second step of applying power higher than that applied in the first step for a pre-set period of time of 1 msec or longer.

11. The method according to claim 1, wherein the plasma exciting step comprises intermittently applying power for a pre-set period of time of 1 msec or longer.

12. The method according to claim 1, wherein the plasma exciting step comprising applying pulse radio-frequency power at an interval of 1 msec or shorter.

13. The method according to claim 1, wherein the reaction gas contains at least Si, C, H and O elements.

14. The method according to claim 1, wherein the film formed on the substrate has a dielectric constant of 2.5 or less upon subsequent thermal treatment.

\* \* \* \* \*